(12) United States Patent
Nagasue

(10) Patent No.: US 6,177,847 B1
(45) Date of Patent: Jan. 23, 2001

(54) OSCILLATING CIRCUIT

(75) Inventor: Makoto Nagasue, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/270,047

(22) Filed: Mar. 16, 1999

(30) Foreign Application Priority Data

Mar. 27, 1998 (JP) .................................................. 10-081737

(51) Int. Cl.[7] ..................................................... H03B 5/30

(52) U.S. Cl. ..................................... 331/116 FE; 331/158

(58) Field of Search ............................. 331/158, 116 FE, 331/116 R, 74, 49, 108 C

(56) References Cited

U.S. PATENT DOCUMENTS 5,777,523 * 7/1998 Lee et al. ................................ 331/74

* cited by examiner

*Primary Examiner*—Robert Pascal
*Assistant Examiner*—Kimberly Glenn
(74) *Attorney, Agent, or Firm*—Jones Volentine, LLC

(57) ABSTRACT

According to the present invention, there is provided an oscillating circuit comprising: an gate circuit coupled between a first electrical source and a second electrical source, the gate circuit outputting an oscillating signal from an output terminal in response to the standby signal; an switch circuit having an one end and an other end, the one end coupled to the output terminal of the gate circuit and the second terminal, the other end coupled to the first terminal, the switch circuit electrically connecting or disconnecting the first terminal and the second terminal in response to the standby signal.

20 Claims, 3 Drawing Sheets

OSCILLATING CIRCUIT

BACKGROUND OF THE INVENTION

1. Field of the Invention

The present invention relates to an oscillating circuit having a function for outputting an oscillating signal by employing a crystal oscillating element or the like, or for outputting an oscillating signal in response to a clock signal supplied from outside.

2. Description of Related Art

A conventional crystal oscillating circuit has a crystal oscillator, a resisting means, a NOR gate, and inverter. One electrode of the crystal oscillator is coupled to a first terminal via a switch, while the other electrode of the crystal oscillator is coupled to a second terminal. The resisting means is coupled between the first terminal and the second terminal. The resisting means is composed of a p-channel type field-effect transistor (hereinafter referred to as "PMOS") and an n-channel field-effect transistor (hereinafter referred to as "NMOS"), the PMOS and the NMOS being connected in parallel to each other between the first terminal and the second terminal. The gate of the PMOS is connected to a ground GND to which a ground potential is applied, while the gate of the NMOS is connected to a power source VDD to which a power potential is applied. The PMOS and the NMOS are always in a conducting state. One input terminal of the NOR gate is connected to the first terminal, the NOR gate being connected between the power source VDD and the ground GND. A standby signal STBY is applied to the other input terminal of the NOR gate. The output terminal of the NOR gate is connected to the second terminal. The inverter is connected to the output terminal of the NOR gate.

The operation of the conventional oscillating circuit will now be described. The standby signal STBY is a signal for setting a low power consumption mode. In the low power consumption mode, the standby signal STBY is set to H level indicative of "valid", while in a normal operation mode, the standby signal STBY is set to L level indicative of "invalid". If the switch is ON in the normal mode, i.e., if the standby signal STBY is L level, then oscillation by the crystal oscillator is performed. At this time, the crystal oscillator operates as a series resonance circuit having an intrinsic series resonance frequency f. The resisting means works as a feedback resistor. The NOR gate is operated as an inverting amplifier by the resisting means. If the series resonance frequency of the crystal oscillator is f, and the gain of the inverting amplifier is x1 or more, then the oscillation is maintained at the frequency f. In the low power consumption mode, i.e., when the standby signal STBY is H level, the NOR gate stops outputting the oscillation signal. The output terminal of the NOR gate is fixed at the ground potential.

SUMMARY OF THE INVENTION

An object of the present invention is to reduce the power consumed in an oscillating circuit.

To this end, according to the present invention, there is provided an oscillating circuit comprising: a first terminal; a second terminal, a gate circuit coupled between a first electrical source and a second electrical source, the gate circuit receiving a signal supplied to the first terminal and a standby signal, the gate circuit outputting an oscillating signal from an output terminal in response to the signal supplied to the first terminal when the standby signal has a first level, the gate circuit outputting no oscillating signal from the output terminal when the standby signal has a second level; and a switch circuit having one end coupled to the output terminal of the gate circuit and the second terminal, and the other end coupled to the first terminal, the switch circuit electrically connecting the first terminal and the second terminal when the standby signal has the first level, the switch circuit electrically disconnecting the first terminal and the second terminal when the standby signal has the second level; and an output circuit outputting a signal in response to a signal outputted from the output terminal of the gate circuit.

The present invention further includes various aspects that will be understood from the following embodiments set forth below.

DESCRIPTION OF THE PREFERRED EMBODIMENTS

Figure 1:
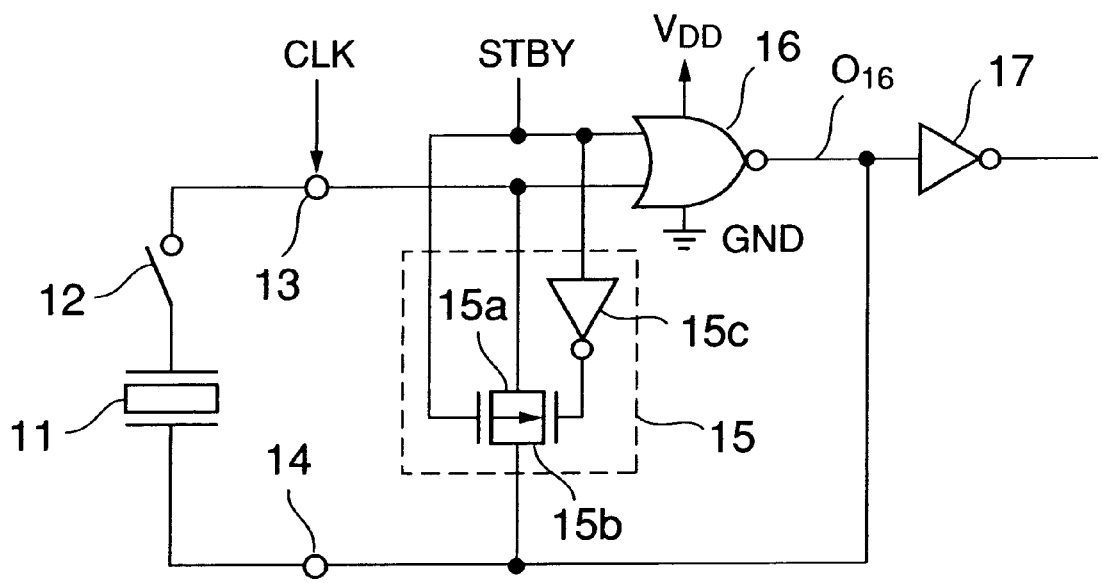
FIG. 1 is a circuit diagram of a crystal oscillating circuit of a first embodiment in accordance with the present invention.

Referring to FIG. 1, the crystal oscillating circuit of a first embodiment will be described.

The crystal oscillating circuit has a crystal oscillator 11, a switch 12, a switch circuit 15, a NOR gate 16, and an inverter 17.

One electrode of the crystal oscillator 11 is connected to a first terminal 13 via the switch 12, while the other electrode of the crystal oscillator 11 is connected to a second terminal 14. The switch circuit 15 is connected between the first terminal 13 and the second terminal 14. The switch circuit 15 is composed of a PMOS 15a, an NMOS 15b, and an inverter 15c. The PMOS 15a and the NMOS 15b are connected in parallel to each other between the first terminal 13 and the second terminal 14. A standby signal is supplied to the gate of the PMOS 15a. The gate of the NMOS 15b is connected to the output terminal of the inverter 15c. The inverter 15c receives the standby signal. The gate of the NMOS 15b receives a signal obtained by inverting the standby signal by the inverter 15c.

One input terminal of the NOR gate is connected to the first input terminal 13, a standby signal STBY being supplied to the other input terminal of the NOR gate 16. The NOR gate 16 is connected between a power source VDD to which a line voltage is applied and a ground GND to which a ground voltage is applied. The output terminal of the NOR gate 16 is connected to the second terminal 14. The input terminal of an inverter 17 which is an output circuit is connected to the output terminal of the NOR gate.

Figure 2:
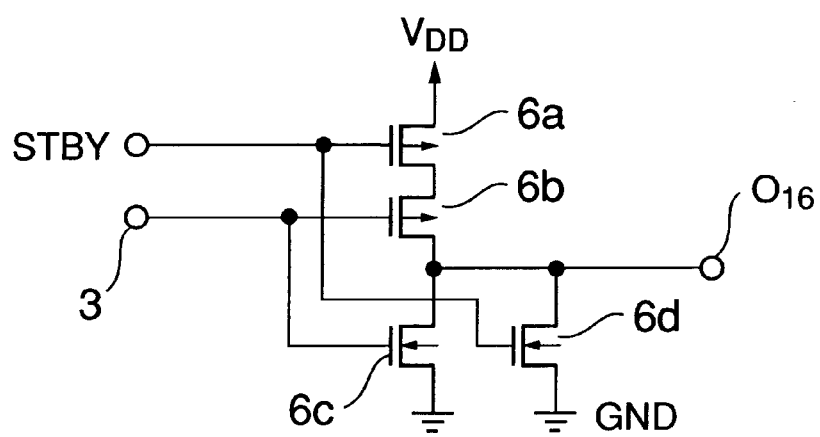
FIG. 2 is a circuit diagram of a NOR gate shown in FIG. 1.

The circuit configuration of the NOR gate 16 will now be described in conjunction with FIG. 2.

In the NOR gate 16, two NMOS's 6c, 6d are connected in parallel between an output terminal O16 and the ground GND. Two PMOS's 6a, 6b are connected in series between the output terminal O16 and the power source VDD. The standby signal STBY is supplied to the gates of the PMOS 6a and the NMOS 6d, while a signal from the first terminal is supplied to the gates of the PMOS 6b and the NMOS 6c.

The operation of the oscillating circuit of the first embodiment will now be described.

The standby signal STBY is a signal for setting the low power consumption mode. In the low power consumption mode, the standby signal STBY is set at the H level indicative of valid. In normal operation mode, the standby signal STBY is set at the L level indicative of invalid.

In the normal operation mode wherein the standby signal STBY is L level, if the switch 12 is ON, then the oscillation using the crystal oscillator 11 is carried out. Since the standby signal STBY is L level, the PMOS 15a and the NMOS 15b turn ON, placing the first terminal and the second terminal in conduction. The ON resistance of the PMOS 15a and the NMOS 15b works as feedback resistance. The NOR gate 16 and the switch circuit 15 constitute an inverting amplifier. This allows the crystal oscillating circuit to continue oscillation by using the crystal oscillator 11. The inverter 17 sets the logic for the oscillating signal, which is output signal of the NOR gate 16. The inverter 17 outputs the output signal of the inverter 17 to a circuit in the following stage.

The crystal oscillating circuit is able to receive a clock signal CLK from outside and output an oscillating signal to the circuit in the following stage. When the clock signal is received from outside, the switch 12 is turned OFF to isolate the first terminal from the crystal oscillator. The incoming clock signal CLK is supplied to the NOR gate 16 via the first terminal 13. Depending upon the level of the clock signal CLK, the NOR gate 16 connects the output terminal O16 to the power source VDD or the ground GND, then sets the voltage of the output terminal O16 and outputs it.

In the low power consumption mode, wherein the standby signal STBY is set at the H level, the NOR gate connects the output terminal O16 to the ground GND. This prevents an oscillating signal from being supplied to the circuit in the following stage even if the oscillation by the crystal oscillator 11 is being performed. Even when the clock signal CLK is being received from outside, no oscillating signal based on the clock signal CLK is supplied to the circuit in the following stage because the voltage of the output terminal O16 is fixed. In other words, the low power consumption mode is set in the circuit in the following stage.

When the standby signal STBY is H level, the standby signal STBY at the H level is supplied to the gate of the PMOS 15a, while a signal at the L level is supplied by the inverter 15c to the gate of the NMOS 15b. Therefore, both the PMOS 15a and the NMOS 15b turn OFF, cutting off the conduction between the first terminal 13 and the second terminal 14. As a result, even when, for example, the clock signal CLK supplied to the first terminal 13 is switched to the H level, no current flows from the first terminal 13 to the ground GND via the switch circuit 15 and the output terminal O16.

In the first embodiment, the switch circuit 15 is composed of the PMOS 15a, the NMOS 15b, and the inverter 15c. Thus, the conduction between the first terminal and the second terminal is cut off when the standby signal STBY is switched to the H level to prevent current from flowing from the first terminal 13 to the ground GND via the switch circuit, permitting lower power consumption.

Figure 3:
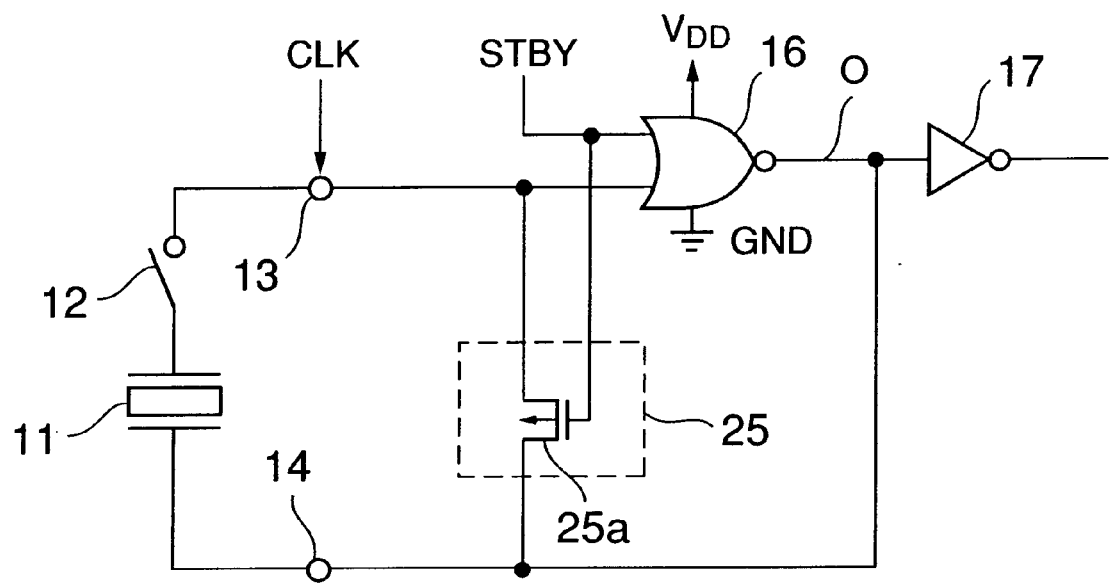
FIG. 3 is a circuit diagram of a crystal oscillating circuit of a second embodiment in accordance with the present invention.

FIG. 3 is a circuit diagram of a crystal oscillating circuit of a second embodiment in accordance with the present invention.

In FIG. 3, the same components as those in FIG. 1 are assigned the same reference numerals.

The crystal oscillating circuit shown in FIG. 3 has a crystal oscillator 11, a switch 12, a switch circuit 25, a NOR gate 16, and inverter 17.

One electrode of the crystal oscillator 11 is coupled to a first terminal 13 via the switch 12, while the other electrode of the crystal oscillator 11 is coupled to a second terminal 14. The switch circuit 25 is connected between the first terminal 13 and the second terminal 14. The switch circuit 25 is constituted by a PMOS 25a, the source and drain of the PMOS 25a being coupled to the first terminal 13 and the second terminal 14, respectively. The gate of the PMOS 15a receives a standby signal.

One input terminal of the NOR gate 16 is connected to the first terminal 13. A standby signal STBY is supplied to the other input terminal of the NOR gate 16. The NOR gate 16 is connected between a power source VDD and a ground GND. The output terminal of the NOR gate 16 is connected to the second terminal 14. The input terminal of the inverter 17, which is an output circuit,, is connected to the output terminal of the NOR gate.

The operation of the crystal oscillating circuit of the second embodiment will now be described.

If the switch 12 is ON when the standby signal STBY is L level, then the oscillation using the crystal oscillator 11 is carried out. Since the standby signal STBY is L level, the PMOS 25a turns ON, placing the first terminal and the s second terminal in conduction. The ON resistance of the PMOS 25a works as feedback resistance. The NOR gate 16 and the switch circuit 25 constitute an inverting amplifier. This allows the crystal oscillating circuit to continue oscillation by using the crystal oscillator 11 as in the case of the first embodiment. The inverter 17 sets the logic for the oscillating signal, which is output signal of the NOR gate 16. The inverter 17 outputs the output signal of the inverter 17 to a circuit in the following stage.

The crystal oscillating circuit is able to receive a clock signal CLK from outside and use it to output an oscillating signal to the circuit in the following stage as in the case of the first embodiment.

In the low power consumption mode, wherein the standby signal STBY is set to the H level, the NOR gate connects an output terminal O16 to the ground GND. This prevents an oscillating signal from being supplied to the circuit in the following stage even if the oscillation by the crystal oscillator 11 is being performed. Even when the clock signal CLK is being received from outside, no oscillating signal based on the clock signal CLK is supplied to the circuit in the following stage because the voltage of the output terminal O16 is fixed. In other words, the low power consumption mode is set in the circuit in the following stage.

When the standby signal STBY is H level, the standby signal STBY at the H level is supplied to the gate of the PMOS 25a. Therefore, the PMOS 25a turns OFF, cutting off the conduction between the first terminal 13 and the second terminal 14. As a result, even when, for example, the clock signal CLK supplied to the first terminal 13 is switched to the H level, no current flows from the first terminal 13 to the ground GND via the switch circuit 25 and the output terminal O16.

In the second embodiment, the switch circuit 25 is composed of the PMOS 25a. Thus, the conduction between the first terminal and the second terminal is cut off when the standby signal STBY is switched to the H level to prevent current from flowing from the first terminal 13 to the ground GND via the switch circuit, permitting lower power consumption.

The switch circuit 25 of the second embodiment is composed of only the PMOS 25a, allowing the circuit scale to be made smaller than that of the crystal oscillating circuit of the first embodiment.

Figure 4:
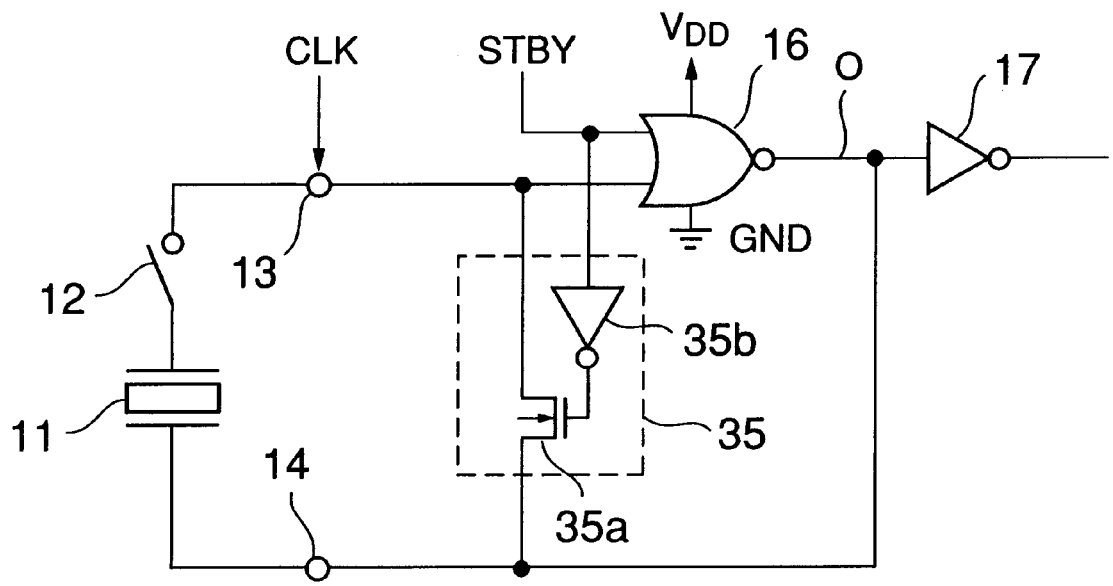
FIG. 4 is a circuit diagram of a crystal oscillating circuit of a third embodiment in accordance with the present invention.

FIG. 4 is a circuit diagram of a crystal oscillating circuit of a third embodiment in accordance with the present invention.

In FIG. 4, the same components as those in FIG. 3 are assigned the same reference numerals.

In the crystal oscillating circuit of the third embodiment, the switch circuit 25 of the crystal oscillating circuit in the second embodiment has been replaced by a switch circuit 35. The crystal oscillating circuit of the third embodiment has the same configuration of the crystal oscillating circuit of the second embodiment except for the switch circuit.

The switch circuit 35 is composed of an NMOS 35a and inverter 35b. The source and drain of the NMOS 35a are connected to a first terminal 13 and a second terminal 14, respectively.

The gate of the NMOS 35a is connected to the output of an inverter 35b to which a standby signal is supplied.

The operation of the oscillating circuit of the third embodiment will now be described.

When a standby signal STBY is set to the L level indicative of invalid, the NMOS 35a turns ON. Hence, the crystal oscillating circuit of the third embodiment operates like the crystal oscillating circuit of the second embodiment. When the low power consumption mode is set and the standby signal STBY is switched to the H level, the NMOS 35a turns OFF. This cuts off a current path between the first terminal 13 and the second terminal 14. In this state, therefore, even if a clock signal CLK is set to the H level, no current flows to a ground GND through the terminals 13 and 14, and an output terminal O16.

In the third embodiment, the switch circuit 35 is composed of the NMOS 35a and the inverter 35b. Thus, when the standby signal STBY is switched to the H level, the conduction between the first terminal and the second terminal is cut off to prevent current from flowing from the first terminal 13 to the ground GND via the switch circuit, permitting lower power consumption. Furthermore, since the switch circuit 35 of the third embodiment is composed only of the NMOS 35a and the inverter 35b, its circuit scale can be made smaller than that of the crystal oscillating circuit of the first embodiment.

Figure 5:
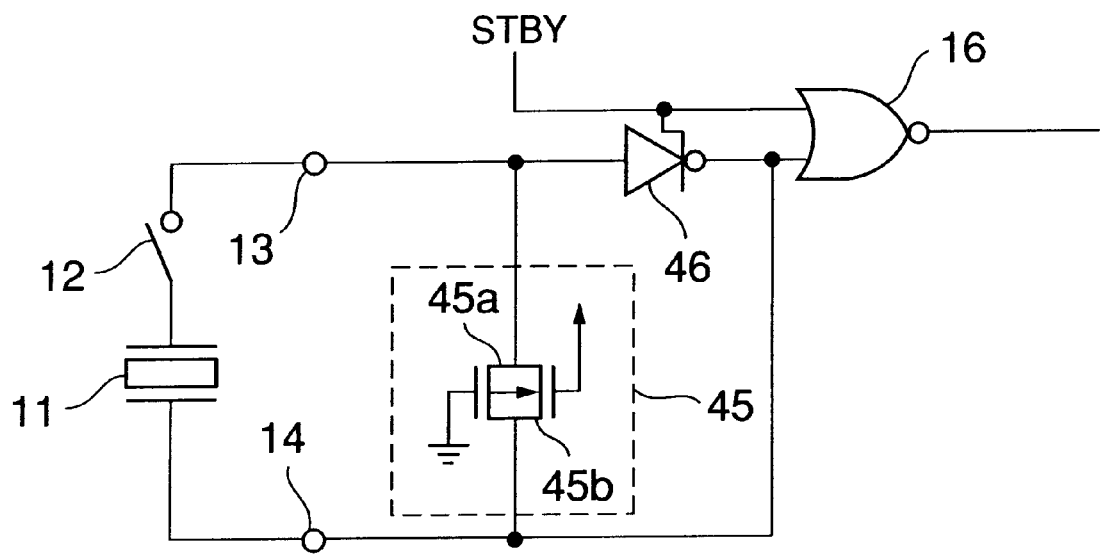
FIG. 5 is a circuit diagram of a crystal oscillating circuit of a fourth embodiment in accordance with the present invention.

Referring now to FIG. 5, a crystal oscillating circuit of a fourth embodiment will be described.

The oscillating circuit has a crystal oscillator 11, a switch 12, a resisting means 45, a NOR gate 16, and a three-state inverter 46.

One electrode of the crystal oscillator 11 is connected to a first terminal 13 via the switch 12, while the other electrode of the crystal oscillator 11 is connected to a second terminal 14. The resisting means 45 is connected between the first terminal 13 and the second terminal 14. The resisting means 45 is composed of a PMOS 45a and an NMOS 45b. The PMOS 45a and the NMOS 45b are connected in parallel to each other between the first terminal 13 and the second terminal 14. The gate of the PMOS 45a is connected to a ground GND, while the gate of the NMOS 45b is connected to a power source VDD.

The input of the three-state inverter 46 is connected to the first terminal 13. Connected to the output of the three-state inverter 46 is one input terminal of the NOR gate 16 and the second terminal 14. A standby signal STBY is supplied to the other input terminal of the NOR gate 16. The NOR gate 16 is connected between the power source VDD and the ground GND.

Figure 6:
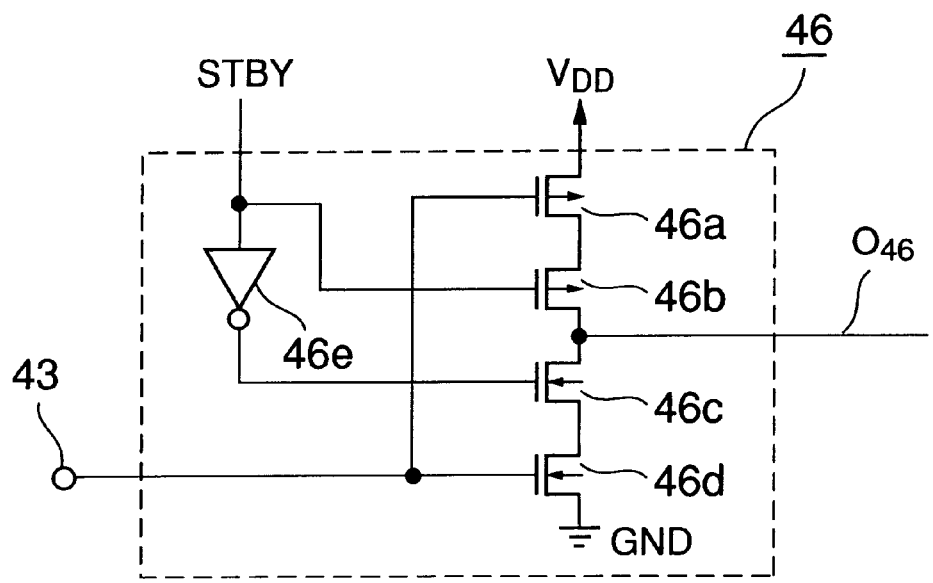
FIG. 6 is a circuit diagram of a three-state inverter in the fourth embodiment.

The circuit configuration of the three-state inverter will now be described in conjunction with FIG. 6.

In the three-state inverter 46, two NMOS's 46c and 46d are connected in series between an output terminal O46 and the ground GND. Further, two PMOS's 46a and 46b are connected in series between the output terminal O46 and the power source VDD. The gates of the PMOS 46a and the NMOS 46d receive a signal from the first terminal 13, while the gate of the PMOS 46b receives the standby signal STBY. The gate of the NMOS 46c receives a signal obtained by inverting the standby signal by an inverter 46e.

The operation of the oscillating circuit of the fourth embodiment will now be described.

If the switch 12 is ON in a normal operation mode, wherein the standby signal STBY is L level, then the oscillation using the crystal oscillator 11 is carried out. Since the standby signal STBY is L level, the PMOS 46b and the NMOS 46c turn ON. The ON resistance of the PMOS 45a and the NMOS 45b works as feedback resistance. The three-state inverter 46 and the resisting means 45 make up an inverting amplifier. This allows the crystal oscillating circuit to continue oscillation by using the crystal oscillator 11. The NOR gate 16 sets the logic for the oscillating signal, which is output signal of the three-state inverter 46. The NOR gate 16 outputs the output signal based on the output signal of the three-state inverter 46 to a circuit in the following stage.

The crystal oscillating circuit is able to receive a clock signal CLK from outside and output an oscillating signal to the circuit in the following stage. When the clock signal is received from outside, the switch 12 is turned OFF to isolate the first terminal 13 from the crystal oscillator 11. The incoming clock signal CLK is supplied to the three-state inverter 46 via the first terminal 13. Depending upon the level of the clock signal CLK, the three-state inverter 46 connects the output terminal O46 to the power source VDD or the ground GND, then sets the voltage of the output terminal O46 and outputs it. The NOR gate 16 outputs a signal based on the voltage of the output terminal O46 of the three-state inverter.

In a low power consumption mode, wherein the standby signal STBY is H level, the PMOS 46b and the NMOS 46c of the three-state inverter 46 turn OFF. This isolates the output terminal O46 from the ground GND and the power source VDD. Hence, even if the oscillation using the crystal oscillator 11 is being performed, the three-state inverter does not supply an oscillating signal to the NOR gate 16. The NOR gate fixes its own output to the ground GND since the standby signal is L level.

Even if a clock signal CLK is being received from outside, the output terminal O46 is isolated from the ground GND and the power source VDD. Further, since the output of the NOR gate 16 is fixed, no oscillating signal based on the clock signal is supplied to a circuit in the following stage. This means that the circuit in the following stage is set for the low power consumption mode.

If the standby signal STBY is switched to the H level, the PMOS 46b and the NMOS 46c turn OFF. At this time, the output terminal O46 is cut off from the power source VDD and the ground GND. As a result, even if, for example, the clock signal CLK supplied to the first terminal 13 is switched to the H level, no current flows from the first terminal 13 to GND via the switch circuit 45 and the output terminal O46.

In the first through third embodiments, the MOS's have been used for the switch circuit; alternatively, however, bipolar transistors may be used instead.

In the fourth embodiment, an or gate may be used in place of the nor gate.

What is claimed is:

1. An oscillating circuit comprising:
   a first terminal;
   a second terminal;
   a gate circuit coupled between a first electrical source and a second electrical source, the gate circuit having a first input terminal receiving a signal supplied to the first terminal, a second input terminal receiving a standby signal and an output terminal, the gate circuit outputting an oscillating signal from the output terminal in response to the signal supplied to the first terminal when the standby signal has a first level, the gate circuit not outputting the oscillating signal from the output terminal when the standby signal has a second level;
   a switch circuit having a first node coupled to the output terminal of the gate circuit and the second terminal and a second node coupled to the first terminal, the switch circuit electrically connecting the first terminal and the second terminal when the standby signal has the first level, the switch circuit electrically disconnecting the first terminal and the second terminal when the standby signal has the second level; and
   an output circuit outputting a signal in response to a signal output from the output terminal of the gate circuit.

2. The oscillating circuit according to claim 1, wherein the gate circuit is a NOR circuit.

3. The oscillating circuit according to claim 1, further comprising a crystal oscillator coupled to the first terminal and the second terminal.

4. The oscillating circuit according to claim 1, wherein the switch circuit comprises:
   an inverter supplied with the standby signal; and
   an NMOS transistor coupled to the first terminal and the second terminal, the NMOS transistor controlled by an output of the inverter.

5. The oscillating circuit according to claim 1, wherein the switching circuit comprises a PMOS transistor coupled to the first terminal and the second terminal, the PMOS transistor controlled by the standby signal.

6. The oscillating circuit according to claim 4, wherein the switching circuit comprises a PMOS transistor coupled to the first terminal and the second terminal, the PMOS transistor controlled by the standby signal.

7. An oscillating circuit comprising:
   a first terminal;
   a second terminal;
   a first gate circuit coupled between a first electrical source and a second electrical source, the first gate circuit having an input terminal receiving a signal supplied to the first terminal, an enable terminal receiving a standby signal, and an output terminal, the first gate circuit outputting an oscillating signal from the output terminal in response to the signal supplied to the first terminal when the standby signal has a first level, the first gate circuit not outputting the oscillating signal from the output terminal when the standby signal has a second level;
   a resistive element having a first node coupled to the output terminal of the gate circuit and the second terminal and having a second node coupled to the first terminal; and
   a second gate circuit coupled between the first electrical source and the second electrical source, the second gate circuit having a first input terminal receiving an output of the first gate circuit, a second input terminal receiving the standby signal and an output terminal, the second gate circuit outputting the oscillating signal in response to the oscillating signal of the first gate circuit when the standby signal has the first level, the second gate circuit not outputting the oscillating signal when the standby signal has the second level.

8. The oscillating circuit according to claim 7, wherein the first gate circuit is a tri-state inverter and the second gate circuit is NOR circuit.

9. The oscillating circuit according to claim 7, further comprising a crystal oscillator coupled to the first terminal and the second terminal.

10. An oscillating circuit comprising:
    a first node;
    a second node;
    a first power supply node applied to a first power supply potential;
    a second power supply node applied to a second power supply potential;
    a gate circuit connected to said first and second power supply nodes, said gate circuit having a first input terminal receiving a signal supplied to said first node, a second input terminal receiving a standby signal having first and second levels and an output terminal connected to said second node, said gate circuit outputting a signal in response to the signal supplied to the first input terminal thereof from the output terminal when the standby signal has the first level, said gate circuit connecting the output terminal to said first power supply node when the standby signal has the second level;
    a switching circuit having a first terminal coupled to said first node and a second terminal coupled to said second node, said switching circuit electrically connecting the first terminal and the second terminal when the standby signal has the first level, said switching circuit electrically disconnecting the first terminal from the second terminal when the standby signal has the second level; and
    an output circuit outputting a signal in response to a signal output from the output terminal of said gate circuit.

11. The oscillating circuit according to claim 10, wherein said gate circuit is a NOR circuit.

12. The oscillating circuit according to claim 10, further comprising a crystal oscillator coupled between said first and second nodes.

13. The oscillating circuit according to claim 10, wherein said switching circuit comprises:
    an NMOS transistor having a first terminal connected to said first node, a second terminal connected to said second node and a gate; and
    an inverter having an input terminal receiving the standby signal and an output terminal connected to the gate of said NMOS transistor.

14. The oscillating circuit according to claim 10, wherein said switching circuit comprises a PMOS transistor having a first terminal connected to said first node, a second terminal connected to said second node and a gate receiving the standby signal.

15. The oscillating circuit according to claim 13, wherein said switching circuit comprises a PMOS transistor having a first terminal connected to said first node, a second terminal connected to said second node and a gate receiving the standby signal.

16. An oscillating circuit comprising:

a first node;

a second node;

a first power supply node applied to a first power supply potential;

a second power supply node applied to a second power supply potential;

an enabling circuit connected to said first and second power supply nodes, said enabling circuit having an input terminal receiving a signal supplied to said first node and an output terminal connected to said second node for outputting a signal in response to the received signal, said enabling circuit disconnecting the output terminal from said first and second power supply nodes in response to a standby signal;

a gate circuit having a first input terminal connected to the output terminal of said enabling circuit, a second input terminal receiving the standby signal and an output terminal; and a resistive element coupled between said first and second nodes.

17. The oscillating circuit according to claim 16, wherein said enabling circuit is a tri-state inverter.

18. The oscillating circuit according to claim 16, wherein said gate circuit is a NOR circuit.

19. The oscillating circuit according to claim 16, further comprising a crystal oscillator coupled between said first and second nodes.

20. The oscillating circuit according to claim 16, wherein said resistive element comprises:

an NMOS transistor having a first terminal connected to said first node, a second terminal connected to said second node and a gate connected to said first power supply node; and a PMOS transistor having a first terminal connected to said first node, a second terminal connected to said second node and a gate connected to said second power supply node.

* * * * *